United States Patent
Chen et al.

(10) Patent No.: US 12,291,661 B2
(45) Date of Patent: May 6, 2025

(54) QUANTUM DOT STRUCTURE, METHOD FOR PRODUCING A QUANTUM DOT STRUCTURE, AND LIGHT EMITTING DEVICE

(71) Applicant: OSRAM Opto Semiconductors GmbH, Regensburg (DE)

(72) Inventors: Peter Chen, New Haven, CT (US); Brian Theobald, Gladstone, OR (US); Joseph Treadway, Portland, OR (US)

(73) Assignee: OSRAM Opto Semiconductors GmbH, Regensburg (DE)

(*) Notice: Subject to any disclaimer, the term of this patent is extended or adjusted under 35 U.S.C. 154(b) by 758 days.

(21) Appl. No.: 17/560,083

(22) Filed: Dec. 22, 2021

(65) Prior Publication Data

US 2023/0193121 A1    Jun. 22, 2023

(51) Int. Cl.
*C09K 11/02* (2006.01)
*C09K 11/08* (2006.01)
*H10H 20/851* (2025.01)

(52) U.S. Cl.
CPC ............ *C09K 11/025* (2013.01); *C09K 11/08* (2013.01); *H10H 20/8512* (2025.01)

(58) Field of Classification Search
CPC ...... C09K 11/08; C09K 11/025; H01L 33/502
See application file for complete search history.

(56) References Cited

U.S. PATENT DOCUMENTS

| | | |
|---|---|---|
| 9,567,514 B2 | 2/2017 | Zhao et al. |
| 10,030,851 B2 | 7/2018 | Koole et al. |
| 10,221,356 B2 | 3/2019 | Ghosh et al. |
| 2013/0112942 A1* | 5/2013 | Kurtin ................. C09K 11/883 438/22 |

OTHER PUBLICATIONS

International Search Report and Written Opinion issued in International Patent Application No. PCT/EP2022/085416 on Apr. 6, 2023.
LV Yanbing et al: "Silica-encapsulated quantum dots for highly efficient and stable flourescence immunoassay of C-reactive protein", Biochemical Engineering Journal, Elsevier, Amsterdam, NL, vol. 137, Jun. 21, 2018, pp. 344-351.

* cited by examiner

*Primary Examiner* — C Melissa Koslow
(74) *Attorney, Agent, or Firm* — ArentFox Schiff LLP

(57) ABSTRACT

A quantum dot structure is provided, the quantum dot structure comprising: a nanocrystalline core from a first semiconductor material, a nanocrystalline shell from a second semiconductor material on the nanocrystalline core, at least one encapsulation layer on the nanocrystalline shell, wherein functional groups are present within the at least one encapsulation layer and/or on the surface of the at least one encapsulation layer facing away from the nanocrystalline shell, the functional groups being able to chemically react in a reversible manner. Further, a method for producing a quantum dot structure and a light emitting device are provided.

20 Claims, 5 Drawing Sheets

QUANTUM DOT STRUCTURE, METHOD FOR PRODUCING A QUANTUM DOT STRUCTURE, AND LIGHT EMITTING DEVICE

A quantum dot structure, a method for producing a quantum dot structure, and a light emitting device are disclosed.

Embodiments provide a quantum dot structure with improved performance. Further embodiments provide a method for producing a quantum dot structure with improved performance and a light emitting device with improved performance.

According to at least one embodiment a quantum dot structure is provided. A quantum dot structure is configured to convert light, in particular due to the confined dimension of a quantum dot (QD) which is normally in the range of nanometers. Light here refers to electromagnetic radiation, in particular in the UV and/or in the visible wavelength range. Converting light means here, that the quantum dot structure is configured to absorb incident electromagnetic radiation of a first wavelength range, a primary radiation, convert the primary radiation into electromagnetic radiation of a second wavelength range, a secondary radiation, and emit the secondary radiation.

According to at least one embodiment the quantum dot structure comprises a nanocrystalline core from a first semiconductor material, a nanocrystalline shell from a second semiconductor material on the nanocrystalline core, and at least one encapsulation layer on the nanocrystalline shell. The first and the second semiconductor materials are according to at least one embodiment different from each other. The materials of the nanocrystalline core and nanocrystalline shell can be selected from a II-VI-compound semiconductor material, a I-III-VI-compound semiconductor material, a III-V-compound semiconductor material or a combination thereof. For example, the nanocrystalline core is cadmium selenide and the nanocrystalline shell is cadmium sulfide.

The nanocrystalline core and the nanocrystalline shell together form a quantum dot (QD). The quantum dot may have a geometry that is spherical, non-spherical, or rod-shaped, for example. The nanocrystalline core can, for example, have diameter in the range of 2 to 6 nanometers. The nanocrystalline shell can, for example, have a diameter of up to 60 nm. The shell further can comprise a long axis and a short axis.

The encapsulated quantum dot, i.e. the quantum dot on which the at least one encapsulation layer is applied, is referred to the quantum dot structure. The encapsulation layer may, for example, have a uniform thickness, such that the quantum dot structure has the same geometry as the quantum dot.

The nanocrystalline shell being "on" the nanocrystalline core means here that the nanocrystalline shell surrounds, i.e., coats, fully or partially the nanocrystalline core. Accordingly, the at least one encapsulation layer being "on" the nanocrystalline shell means here that the at least one encapsulation layer surrounds, i.e. coats, fully or partially, in particular fully, the nanocrystalline shell. In particular, "on" comprises, that there is a direct mechanical contact between the core and the shell or the shell and the encapsulation layer or there is an indirect contact between the core and the shell or the shell and the encapsulation layer. For example, there may be more than one shell surrounding the core and being encapsulated by the encapsulation layer. In this case, the outermost shell has a direct mechanical contact to the at least one encapsulation layer.

The at least one encapsulation layer is configured to protect the materials of the nanocrystalline core and the nanocrystalline shell from the influence of the external environment, in particular from oxygen and water, which could lead to an oxidation of the semiconductor materials. "At least one encapsulation layer" means, that the quantum dot structure comprises one encapsulation layer or two or more encapsulation layers. All features described below with respect to the at least one encapsulation layer are also valid for a second or more encapsulation layers if present.

According to at least one embodiment functional groups are present within the at least one encapsulation layer and/or on the surface of the at least one encapsulation layer facing away from the nanocrystalline shell, the functional groups being able to chemically react in a reversible manner. A functional group is to be understood as a moiety of a molecule which, for example, is configured to undergo a chemical reaction with another functional group of the same or of another molecule. The molecules with the functional groups form the bulk of the encapsulation layer when the functional groups are present within the encapsulation layer. In this case, the functional groups can be, for example, present in pores within the encapsulation material forming the encapsulation layer. Alternatively or additionally, the molecules with the functional groups form the surface of the at least one encapsulation layer facing away from the nanocrystalline shell.

A chemical reaction in a reversible manner means that the functional groups undergo a first kind of a chemical reaction forming a new compound and a chemical byproduct. The new compound and the chemical byproduct are able to undergo a second kind of a chemical reaction wherein the original functional group or groups are restored. The first and the second chemical reaction are, thus, coupled to each other, as, for example, a condensation reaction and a hydrolysis reaction. "Being able to chemically react" is referred to the functional groups that are configured to undergo the chemical reactions and that undergo the chemical reactions in dependence of the surrounding conditions.

According to at least one embodiment a quantum dot structure is provided, the quantum dot structure comprising:
- a nanocrystalline core from a first semiconductor material,
- a nanocrystalline shell from a second semiconductor material on the nanocrystalline core,
- at least one encapsulation layer on the nanocrystalline shell,
- wherein functional groups are present within the at least one encapsulation layer and/or on the surface of the at least one encapsulation layer facing away from the nanocrystalline shell, the functional groups being able to chemically react in a reversible manner.

The reliability of devices employing quantum dot structures as conversion material is, in particular, sensitive to the moisture content of the operating environment. During the device's lifetime, it is known that water is small enough to diffuse through conventional encapsulation layers to the surface of the quantum dots. At low moisture content, an increase in photoluminescence quantum yield (PLQY) is observed. However, at higher values, moisture causes a decrease in PLQY caused by densification of the conventional encapsulation layer which prevents further water diffusion. The water content around a quantum dot is, thus, detrimental at both high and low levels of moisture.

Thus, there is an optimal moisture level on the surface of quantum dots that is correlated to a stable quantum dot in a conversion layer of a light emitting device, such as a light emitting diode (LED). Conventionally, water diffusion is limited by the pore size of the encapsulation material and humidity and temperature of the device testing conditions. Reliability of quantum dot containing light emitting devices, such as LEDs, is conventionally achieved either by the growth of a robust barrier layer, or through hermetical sealing of the quantum dots. Both of these approaches fail to address the moisture variability that is required for long term reliability. Hermetical sealing produces an environment that is too dry, and typical barrier layers undergo structural changes during the span of the device lifetime that affects the localized moisture content at the quantum dot surface. Certain approaches to densifying the barrier material may increase the lifetime of the quantum dot containing devices, but this densification also inhibits any water diffusion to the quantum dot surface, which is detrimental to the device performance.

A quantum dot structure with an encapsulation layer as described here, however, realizes a control over the rate at which water diffuses and interacts with the quantum dot surface. Such a control allows for an optimal tuning improved performance lifetime of quantum dot containing devices, such as LEDs. Due to the functional groups being configured to chemically react, alone or with each other, in a reversible manner water can be released to the quantum dot surface and the moisture content can be lowered within the encapsulation. Thus, the encapsulation layer provides a reversible approach to modulating the water content and can act as a water bank to the quantum dot during the operation of a device, allowing for more precise control over the water content by acting as a moisture buffer.

Moreover, the moisture content of the quantum dot structure can be predicted by controlling the amount of functional groups on the surface of or within the at least one encapsulation layer.

According to at least one embodiment the functional groups are able to react by a condensation and a hydrolysis reaction. Thus, the functional groups, which can also be called condensation precursors, are configured to reversibly undergo condensation, in particular to release water to the quantum dot surface by producing water as a byproduct, and hydrolysis, in particular to lower the moisture content within the encapsulation by reacting with water molecules. The condensation reaction can take place between two different functional groups or within one functional group. Functionalization with functional groups that are able to reversibly undergo condensation and hydrolysis is simple and cost effective.

According to at least one embodiment the at least one encapsulation layer comprises an encapsulation material.

According to at least one embodiment the at least one encapsulation layer comprises an encapsulation material and the functional groups are chemically bonded to the encapsulation material. Thus, the functional groups are moieties of the encapsulation material. An encapsulation material having functional groups bonded to it is here also referred to as functionalized encapsulation material. When undergoing a condensation reaction the functionalized encapsulation material can be crosslinked or densified by reaction of the functional groups, while the crosslinking or densification can be reversed by the hydrolysis of the bondings formed during the condensation reaction.

According to at least one embodiment the encapsulation material comprises pores. If present, the functional groups can be bonded to surfaces of the encapsulation material within the pores and/or on the surface of the encapsulation material forming the surface of the encapsulation layer facing away from the shell.

According to at least one embodiment the encapsulation material is selected from a group of metal oxides the group consisting of silica, ($SiO_x$), titanium oxide ($TiO_x$), zirconium oxide ($ZrO_x$), alumina ($AlO_x$), magnesium oxide ($MgO_x$), and hafnia ($HfO_x$). In particular, the encapsulation material comprises or consists of one of these materials. The encapsulation layer containing the encapsulation material has according to at least one embodiment a thickness in the range of up to 500 nm. The encapsulation layer containing the encapsulation material can be an amorphous layer.

According to at least one embodiment the functional groups comprise first functional groups and second functional groups. In particular, the first functional groups are different from the second functional groups. The first and second functional groups can be present on one molecule of the encapsulation material or on different molecules of the encapsulation material.

According to at least one embodiment a pair of first functional groups and second functional groups is chosen from amine groups and carboxyl groups, thiourea groups and hydroxyl groups, hydroxyl groups and carboxyl groups, and carboxyl groups and hydroxyl groups. Thus, first and second functional groups may be present within the at least one encapsulation layer and/or on the surface of the at least one encapsulation layer facing away from the nanocrystalline shell, the first functional groups being able to chemically react with the second functional groups in a reversible manner. For example thiourea groups can react with alcohols, alcohols can react with carboxylic acids by an esterification condensation, or a condensation can take place between carboxylic acids and residual hydroxy groups, such as silanol groups, on an oxide surface of the encapsulation material.

According to at least one embodiment the functional groups are chosen from the group of α-hydroxy aldehyde groups, β-hydroxy aldehyde groups, α-hydroxy ketone groups, β-hydroxy ketone groups, and mixtures thereof. Such kind of groups each are able to undergo condensation by eliminate water and reversibly undergo hydrolysis by reacting with water.

According to at least one embodiment the quantum dot structure comprises a plurality of encapsulation layers, wherein each two encapsulation layers are separated by the functional groups. Thus, encapsulation layers with or without functional groups within the respective layers are separated by functional groups that are on the surface of the respective underlying encapsulation layer. The separating layer of functional groups may be called intermediate layer and acts as a gate to water diffusing towards the quantum dot.

According to at least one embodiment the quantum dot structure further comprises a sealing layer on the at least one encapsulation layer, the sealing layer comprising a controlled porous glass. According to at least one embodiment, the controlled porous glass may comprise only silica nanopowder, and/or may comprise one or more compounds in addition to the silica nanopowder. According to at least one embodiment the sealing layer has a thickness in a range of 200 nm to 500 nm inclusive. Such a sealing layer allows for a chemical sealing of the outermost encapsulation layer of the quantum dot structure and hence an immutable moisture content and a stable and controlled humidity within the quantum dot structure.

According to at least one embodiment the quantum dot structure further comprises a barrier layer on the at least one encapsulation layer, the barrier layer comprising a metal oxide of a group consisting of silica, titanium oxide, zirconium oxide, alumina, magnesium oxide, and hafnia. The metal oxide of the barrier layer is according to at least one embodiment applied via atomic layer deposition (ALD). The metal oxide can be chosen based on its pka. According to at least one embodiment the barrier layer comprises a metal oxide having a pKa in a range of including 10 to including 20. A barrier layer comprising a metal oxide with a suitable pka provides greater tunability of moisture content as the pH of operating environment may change during the lifetime of a device, such as a LED. According to at least one embodiment, the barrier layer has a thickness in the range of up to 50 nm inclusive.

According to at least one embodiment a moisture content on a surface of the nanocrystalline shell and/or the nanocrystalline core is controlled by the at least one encapsulation layer. Due to the functionalizations on the surface of and/or within the encapsulation layer that are able to chemically react in a reversible manner the quantum dot structure has a moisture buffer capacity wherein the moisture content can be adapted by condensation and hydrolysis.

Further, a method for producing a quantum dot structure is provided. The method is configured to produce a quantum dot structure as described here. Hence, all features and embodiments disclosed with respect to the quantum dot structure are also valid for the method and vice versa.

According to at least one embodiment the method comprises the steps:

forming a nanocrystalline core from a first semiconductor material, forming a nanocrystalline shell from a second semiconductor material on the nanocrystalline core, forming at least one encapsulation layer on the nanocrystalline shell, wherein functional groups are present within the at least one encapsulation layer and/or on the surface of the at least one encapsulation layer facing away from the shell, the functional groups being able to chemically react in a reversible manner.

The step forming at least one encapsulation layer may be repeated if more than one, for example two or more, encapsulation layers are desired. During the step forming at least one encapsulation layer encapsulation material comprising the functional groups is applied continuously or alternately with encapsulation material without functional groups.

The water diffusion to the surface of the quantum dot, i.e. the surface of the nanocrystalline shell and/or the nanocrystalline core, in the produced quantum dot structure can be controlled by the density of functionalized encapsulation material, i.e. by the amount of functional groups introduced into the encapsulation material, and/or by the stereo and electronic properties of the functional groups, for example.

According to at least one embodiment forming the at least one encapsulation layer is performed by a sol-gel process. Thus, the method for producing a quantum dot structure having functional groups within and/or on the surface of the encapsulation layer is compatible with sol-gel processes that are used to make known encapsulation barriers. Additionally, the functionalization is simple and cost effective.

According to at least one embodiment the sol-gel process is chosen from a reverse micelle sol-gel process and a Stober method. For example, in a Stober method a reaction mixture contains a silica source such at tetramethyl orthosilicate and water for catalysis.

According to at least one embodiment in the reverse micelle sol-gel process pairings of a nanocrystalline core and a nanocrystalline shell are dissolved in a first solvent, for example a non-polar solvent, to form a first solution. According to at least one embodiment the first solution, subsequently, is added to a second solution that comprises a second solvent, in particular a non-polar solvent. The first and the second solvent can be the same or different from each other.

According to at least one embodiment, a precursor is added to the second solution. The precursor is configured to start the sol-gel reaction. A base or an acid, for example ammonium hydroxide, can be added to the second solution. The base or acid is used for the hydrolysis of the precursor to form a uniform encapsulation layer on the surface of the quantum dot. Optionally, further species may be added to the second solution along with the first solution. Additional species comprise, for example, 3-aminopropyltrimethoxysilane, 3-mercaptotrimethoxysilane, or a silane comprising a phosphonic acid or carboxylic acid functional group. Additionally, the second solution optionally comprises one or more surfactants.

After the sol-gel reaction is finished, the first and second solvents are according to at least one embodiment removed. A hard material, optionally comprising pores, is formed, said material forming the encapsulation layer.

According to at least one embodiment forming at least one encapsulation layer comprises applying precursors of an encapsulation material and subsequently applying precursors of a functionalized encapsulation material. The application of the precursors in particular takes place during the reverse micelle sol-gel process, in particular, the precursors are added to the second solution. According to at least one embodiment a reverse sol-gel process is performed with precursors of the encapsulation material in order to form an initial encapsulation layer without functional groups. During this process the precursors of the encapsulation material are replaced by the precursors of the functionalized encapsulation material in order to form an encapsulation layer wherein functional groups are present within the encapsulation layer. Alternatively or in addition, according to at least one embodiment a reverse micelle process is performed with precursors of the encapsulation material in order to form an initial encapsulation layer without functional groups. After completion of this process an additional reverse micelle sol-gel process is performed employing precursors of a functionalized encapsulation material in order to form a functionalized encapsulation layer on the surface of the initial encapsulation layer and, thus, an encapsulation layer wherein functional groups are present on the surface of the encapsulation layer.

According to at least one embodiment the surface of the encapsulation layer facing away from the nanocrystalline shell is treated with a base or an acid and/or remaining precursor and reaction byproducts are removed from the surface of the encapsulation layer after forming the at least one encapsulation layer. Treating the formed encapsulation layer enables, in particular, the application of one or more additional encapsulation layers on the surface of previously formed encapsulation layer. The acid and the base are, for example, chosen from mineral acids, mineral bases, NaOH, LiOH, KOH, $Ca(OH)_2$, HCl, $NH_4OH$, $H_2SO_4$, $H_3PO_4$, acetic acid, sodium carbonate and potassium carbonate.

According to at least one embodiment the method further comprises forming at least one additional encapsulation layer on the surface of the encapsulation layer facing away from the nanocrystalline shell. The at least one additional encapsulation layer may be formed in the same way as explained with respect to the at least one encapsulation layer.

According to at least one embodiment precursors of the encapsulation material are chosen from a group consisting of tetramethyl orthosilicate, tetraethyl orthosilicate, titanium isopropoxide, titanium butoxide, aluminum isopropoxide, aluminum-tri-sec-butoxide, aluminum tert-butoxide, zirconium propoxide, zirconium butoxide, tetraisopropoxyhafnium, hafnium n-butoxide, magnesium chloride hexahydrate, and mixtures thereof. These precursors are suitable to form initial encapsulation layers comprising a metal oxide of the group silica, titanium oxide, zirconium oxide, alumina, magnesium oxide, and hafnia.

According to at least one embodiment precursors of a functionalized encapsulation material are chosen from a group consisting of (3-aminopropyl)triethoxysilane, (triethoxysilyl)alkanoic acid, thiourea, silyl esters, dicholorsilanes, $\alpha$-hydroxy aldehydes, $\beta$-hydroxy aldehydes, $\alpha$-hydroxy ketones, $\beta$-hydroxy ketones, and mixtures thereof. These precursors are suitable to form functional groups being bonded to encapsulation material, in particular to form functionalized silica. For example, the precursors of a functionalized encapsulation material comprise metal oxide precursors modified with functional groups as mentioned above, or, the functional groups are added after the metal oxide is formed, i.e. a post-modification is performed.

According to at least one embodiment the method further comprises the step forming a sealing layer on the at least one encapsulation layer, the sealing layer comprising a controlled porous glass, in particular silica nanopowder. Forming a sealing layer comprises, according to at least one embodiment, modifying a controlled porous glass with functional groups, entrapping the quantum dots, in particular the quantum dot structures, inside the controlled porous glass, and sealing the pores of the controlled porous glass with additional metal oxide.

According to at least one embodiment the method further comprises the step forming a barrier layer on the at least one encapsulation layer. Such a barrier layer can be formed by atomic layer deposition (ALD). In this step a metal oxide can be applied, the metal oxide being chosen from a group consisting of silica, titanium oxide, zirconium oxide, alumina, magnesium oxide, and hafnia.

Further a light emitting device is provided. The light emitting device comprises a quantum dot structure as described herein. Thus, all features and embodiments related to the quantum dot structure and the method for producing a quantum dot structure are also valid for the light emitting device and vice versa.

According to at least one embodiment the light emitting device comprises: a semiconductor chip configured to emit electromagnetic radiation of a first wavelength range, and a conversion layer on the semiconductor chip, wherein the conversion layer is configured to convert the electromagnetic radiation of the first wavelength range into electromagnetic radiation of a second wavelength range, wherein the conversion layer comprises a quantum dot structure according to embodiments described herein.

The electromagnetic radiation of the first wavelength may also be called primary radiation and corresponds to the emission spectrum of the semiconductor chip. According to at least one embodiment the primary radiation comprises wavelengths from the UV range and/or from the visible range, in particular from the blue range. For example, the primary radiation comprises wavelengths in the range of 400 nm to 500 nm.

The semiconductor chip may be a light emitting diode chip or a laser diode chip. According to at least one embodiment the light emitting device is a light emitting diode (LED). In particular, the semiconductor chip comprises an epitaxial grown semiconductor layer sequence with an active region being able to generate electromagnetic radiation. For example the active region comprises a pn-junction or a quantum well structure.

The conversion layer is, in particular, applied on the radiation exit surface of the semiconductor chip such that light emitted from the semiconductor chip reaches at least partially the conversion layer. The quantum dot structure in the conversion layer converts the electromagnetic radiation of the first wavelength range into electromagnetic radiation of a second wavelength range, also called secondary radiation. The electromagnetic radiation of the second wavelength range corresponds to the emission spectrum of the quantum dot structure. In particular, the first wavelength range is different from the second wavelength range.

The conversion layer, or the quantum dot structures being contained in the conversion layer, can convert the light emitted by the semiconductor chip fully. Alternatively, the conversion layer can convert the light emitted by the semiconductor chip partially while another part is transmitted, such that the device emits a mixed light comprising primary and secondary radiation.

Due to the properties of the quantum dot structure as explained above the reliability of the device is very high as the encapsulation layer acts as a water bank to the quantum dots during operation of the device, allowing for more precise control over the water content by acting as a moisture buffer. Thus, the light emitting device has improved performance lifetime due to extremely stable quantum dots that are not affected by too high or too low moisture content on their surface as they are encapsulated by the encapsulation layer described herein. The functional groups in the encapsulation layer allow reversible condensation and hydrolysis in order to release water to the quantum dot surface and to lower the moisture content on the quantum dot surface, respectively.

According to at least one embodiment the conversion layer consists of the quantum dot structure. Alternatively, according to at least one embodiment the quantum dot structure is embedded in a matrix. Matrix materials can be chosen from a group consisting of glass, such as, for example, quartz glass, silicates, water glass and mixtures thereof, and polymers, such as, for example, polystyrene, polysiloxane, polysilzane, PMMA, polycarbonate, polyacrylate, polytetrafluoroethylene, polyvinyl, silicone resin, silicone, epoxy resin, and mixtures thereof.

According to at least one embodiment the conversion layer is applied directly or indirectly on the semiconductor chip. If the conversion layer is applied indirectly on the semiconductor chip, an adhesive layer may additionally be present between conversion layer and semiconductor chip.

According to at least one embodiment the device further comprises a casting. The casting can surround the semiconductor chip and the conversion layer in order to protect them from influences of the environment. A casting has, for example a high transmittance, for example at least 85%, of primary and/or secondary radiation.

Advantageous embodiments and developments of the structure, the optoelectronic device, and the method for producing a structure will become apparent from the exemplary embodiments described below in conjunction with the figures.

In the exemplary embodiments and figures, similar or similarly acting constituent parts are provided with the same reference symbols. The elements illustrated in the figures and their size relationships among one another should not be regarded as being true to scale. Rather, individual elements may be represented with an exaggerated size for the sake of better representability and/or for the sake of better understanding.

Figure 1:
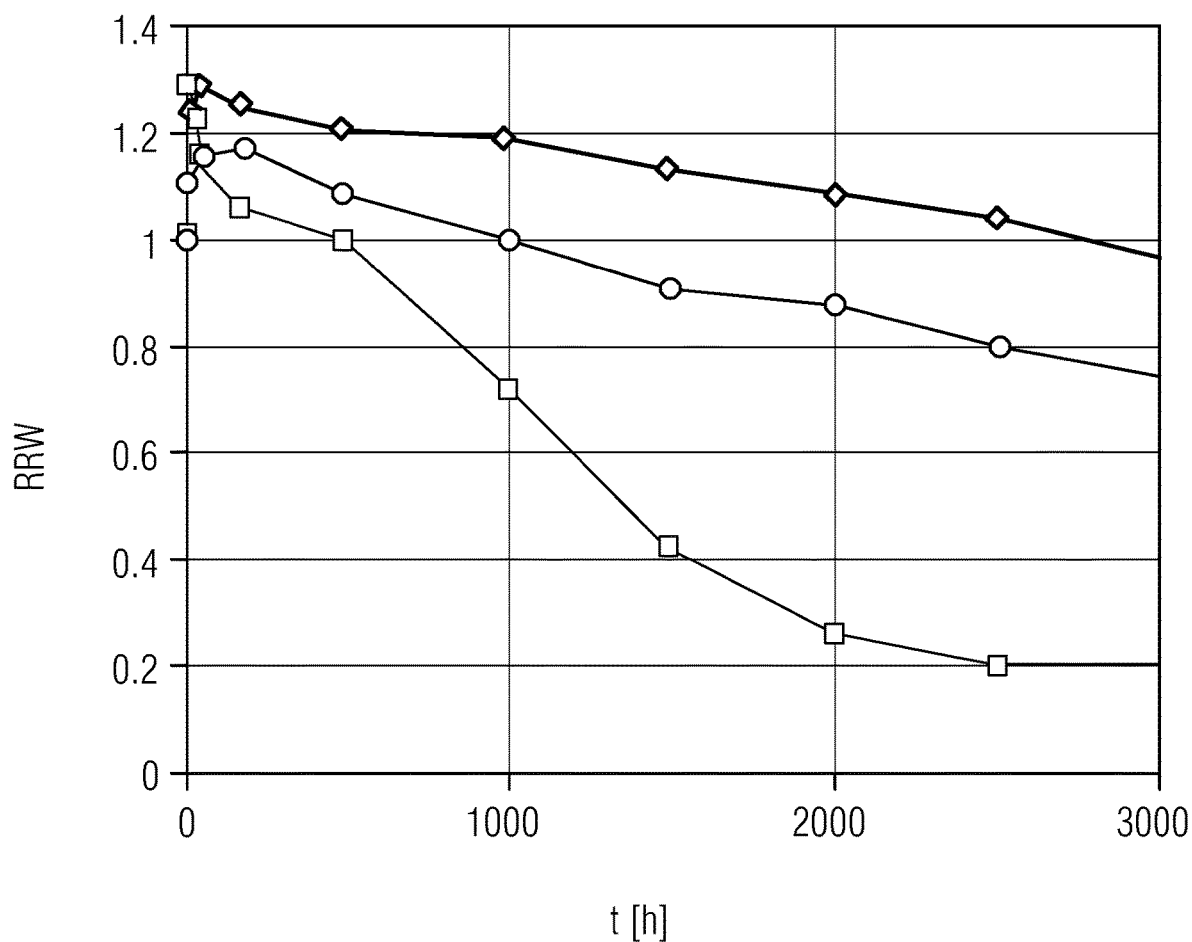
FIG. 1 shows the long term stability of a quantum dot in dependence of moisture level.

FIG. 1 visualizes the sensitivity of LED devices with quantum dots as phosphors. In this example, red emitting quantum dots were embedded in a conversion layer of a LED device and the radiant flux (RRW, relative red watts) is measured in dependence of the time t (in hours). The first measurement (squares) is conducted with 297 g/m$^3$ H$_2$O at 85° C. and a relative humidity Rh of 85%, the second measurement (rhombus) is conducted with 116 g/m$^3$ H$_2$O at 60° C. and a relative humidity Rh of 90%, and the third measurement (circles) is conducted with 28 g/m$^3$ H$_2$O at 115° C. and a relative humidity Rh of less than 5%.

Thus, from FIG. 1 it becomes clear that there is an optimal moisture level which correlates to stable quantum dots. If the moisture level is too high as in the first measurement, the radiant flux decreases immediately and the moisture causes a decrease in PLQY (photoluminescence quantum yield) caused by a densification of the encapsulation layer which prevents further water diffusion. On the other hand, if the moisture level is low as in the third measurement, an increase in PLQY is observed, however after a short time PLQY decreases as well. With a medium moisture content as in the second measurement the highest and most stable PLQY is achieved.

Figure 2A:
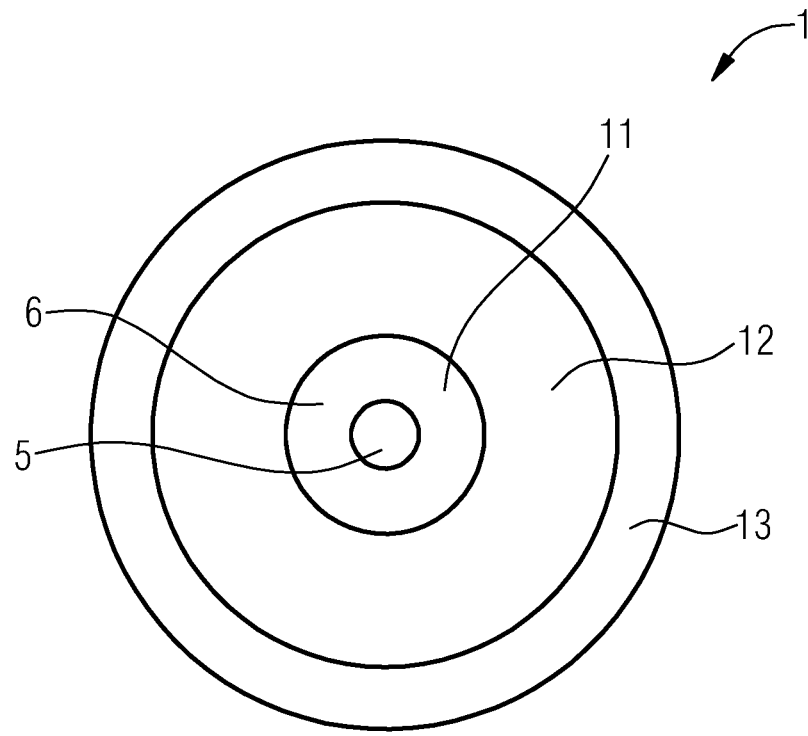
FIGS. 2a and 2b show schematic side views of cross sectional areas of different quantum dot structures according to exemplary embodiments.
Figure 2B:
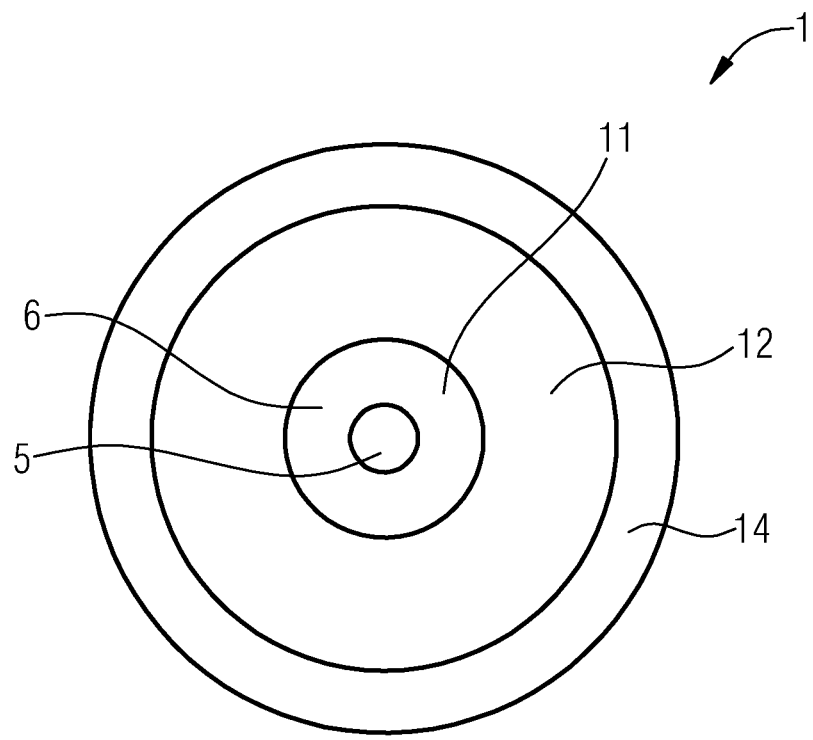

FIGS. 2a and 2b show schematic side views of cross sectional areas of different quantum dot structures 1 according to exemplary embodiments. A nanocrystalline core 5 from a first semiconductor material is surrounded by a nanocrystalline shell 6 from a second semiconductor material, and an encapsulation layer 12 surrounds the nanocrystalline shell 6. Core 5 and shell 6 together form the quantum dot 11. The encapsulation layer 12 comprises an encapsulation material with functional groups chemically bonded to the encapsulation material. The functional groups are present within the encapsulation layer 12 and/or on the surface of the at least one encapsulation layer facing away from the nanocrystalline shell 6. For sake of clarity only one encapsulation layer 12 is shown here, however, two or more additional encapsulation layers 12 could be present on the shown encapsulation layer as well.

The encapsulation material comprises a metal oxide selected from a group consisting of silica, titanium oxide, zirconium oxide, alumina, magnesium oxide, and hafnia. In the following, examples with silica as encapsulation material are discussed in further detail.

The functional groups are chosen from pairs of amine groups and carboxyl groups, thiourea groups and hydroxyl, in particular alcohol groups, hydroxyl groups and carboxyl groups, and carboxyl groups and hydroxyl groups, in particular silanols. The pairs are able to undergo reversible chemical reactions, in particular condensation and hydrolysis. Additionally, the functional groups can be chosen from α-hydroxy aldehyde groups, β-hydroxy aldehyde groups, α-hydroxy ketone groups, β-hydroxy ketone groups. These functional groups are able to condensate and hydratize as a single functional group. By these reversible reactions a moisture buffer capacity is provided wherein moisture can be increased by condensation reactions or decreased by hydrolysis reactions. Thus, an optimal moisture content can be conserved.

Also shown in FIG. 2a is an optional sealing layer 13, the sealing layer 13 comprising or consisting of controlled porous glass, for example silica nanopowder. Such a sealing layer 13 provides a chemical sealing of the outermost encapsulation layer 12 and hence an immutable moisture content inside of the sealing layer 13, i.e. in the environment surrounding the quantum dot 11.

As shown in FIG. 2b, there is instead of the sealing layer 13 an optional barrier layer 14 on the surface of the outermost encapsulation layer 12. Such a barrier layer 14 comprises or consists of a metal oxide which is applied via ALD. The metal oxide can be chosen based on its pka which would allow for greater tunability of moisture content as the pH of the operating environment changes during the lifetime of a device. Possible metal oxides are silica, titanium oxide, zirconium oxide, alumina, magnesium oxide, and hafnia.

An exemplary quantum dot structure is produced as follows: Quantum dots, comprising a core and two shells, the quantum dots comprising CdSe/CdS/ZnS are provided. The quantum dots are combined with tetraethylorthosilicate (TEOS) and ammonium hydroxide in the presence of cyclohexane and non-ionic surfactant. This mixture is combined with aminopropyltrimethoxy silane, and further with triethoxysilylpropionate ethyl ester. This mixture is allowed to react at room temperature. The resulting particles are isolated by centrifugation. A second layer may be applied by using only TEOS and no amino or carboxy groups.

Figure 3A:
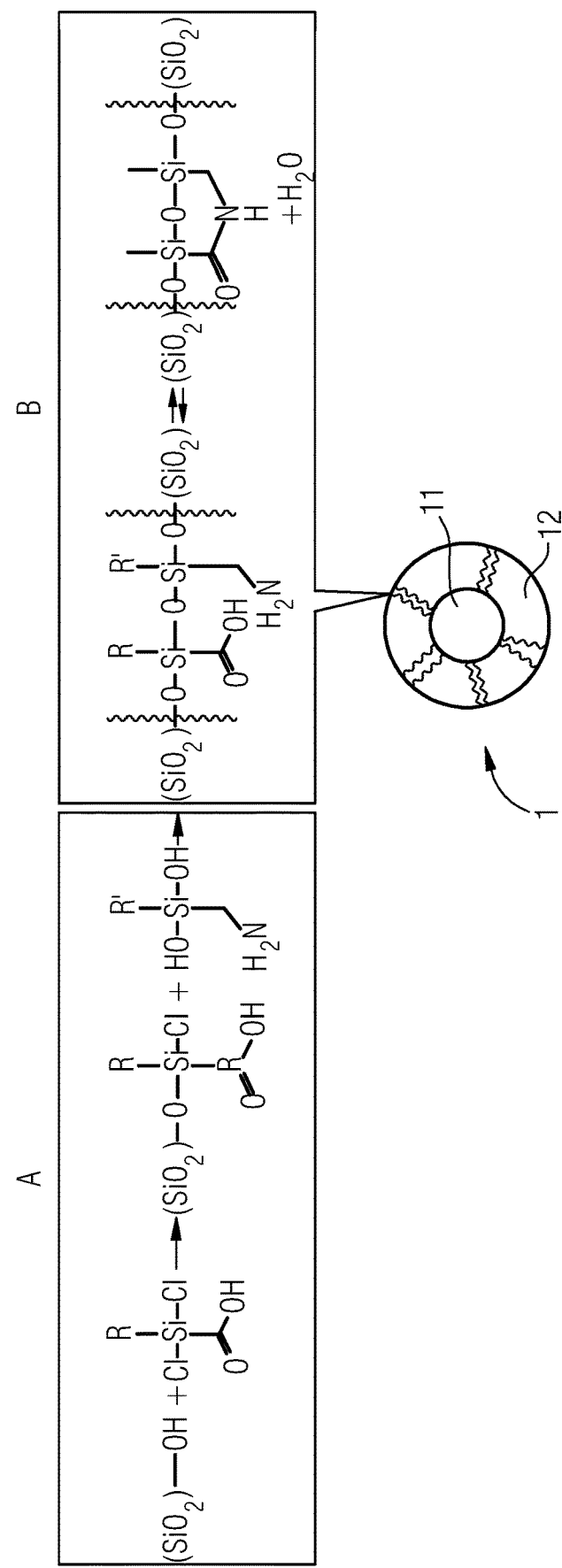
FIGS. 3a and 3b show schematic side views of cross sectional areas of different quantum dot structures according to exemplary embodiments and corresponding reaction schemes.
Figure 3B:
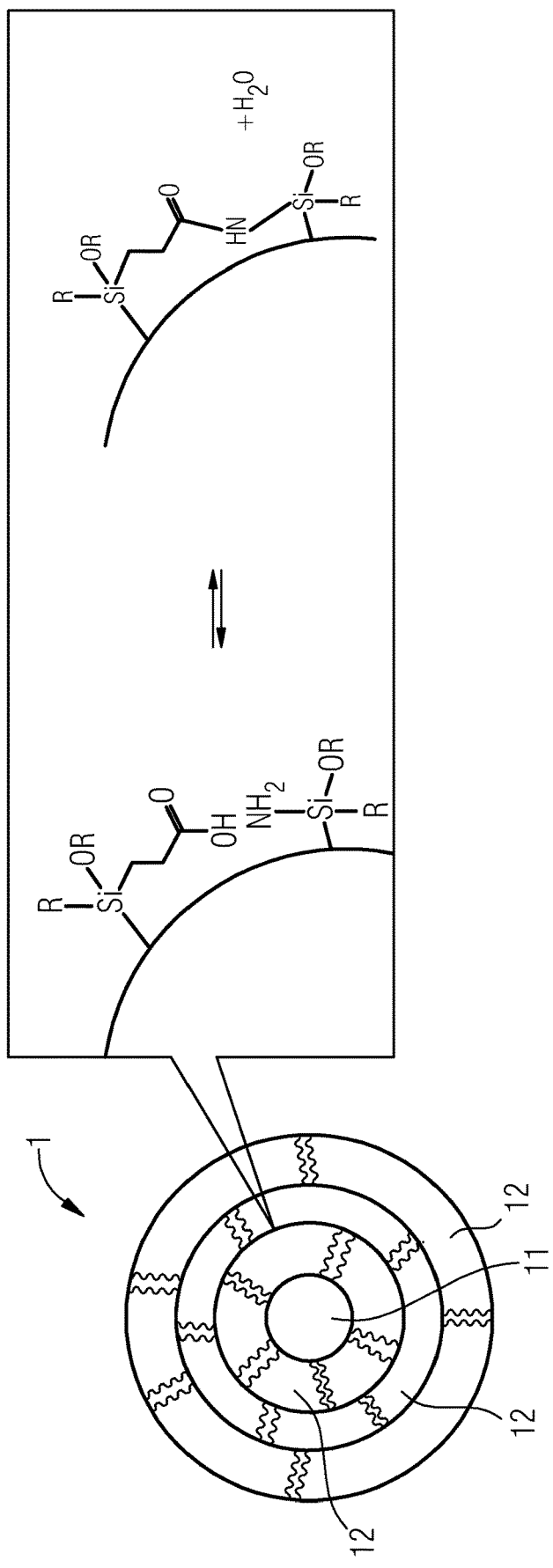

FIGS. 3a and 3b show schematic side views of cross sectional areas of different quantum dot structures according to exemplary embodiments and corresponding reaction schemes.

FIG. 3a relates to an exemplary embodiment where functional groups are present within the encapsulation layer 12. The quantum dot structure 1 is shown with the quantum dot 11 and the encapsulation layer 12. In the encapsulation layer 12 internal surfaces, for example pores, of the encapsulation material are indicated where the functional groups are present and are chemically reacting with each other. Such a reversible reaction is shown in the box B on top of the quantum dot structure 1. In this exemplary embodiment a silica with a carboxyl group and an amine group is shown. The carboxyl group reacts with the amine group reversibly by condensation and hydrolysis. Carboxyl and amine group are chemically bonded to the silica. During the reactions water is released or consumed. Box A shows an exemplary reaction for functionalizing silica with a carboxyl group and an amine group. This reaction can be performed during a reverse micelle sol-gel process.

FIG. 3b shows a quantum dot structure 1 with multiple, namely three encapsulation layers 12 surrounding the quantum dot 11. Here functional groups, again for example an amine group and a carboxyl group, are present on the surface of an encapsulation layer 12 as shown in detail in the box. Thus, the functional groups separate the encapsulation layers 12 from each other, undergo there reversibly condensation and hydrolysis and act as a gate to water diffusing towards the quantum dot 11.

Figure 4:
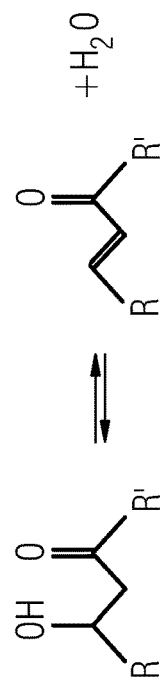
FIG. 4 shows a reaction scheme according to another exemplary embodiment.

FIG. 4 shows a reaction scheme between functional groups according to another exemplary embodiment. The functional groups can be present within the encapsulation layer 12 similar to FIG. 3a or on its surface similar to FIG. 3b. In this exemplary embodiment the functional group is a β-hydroxy ketone which reversibly hydrolysates and condensates.

Figure 5:
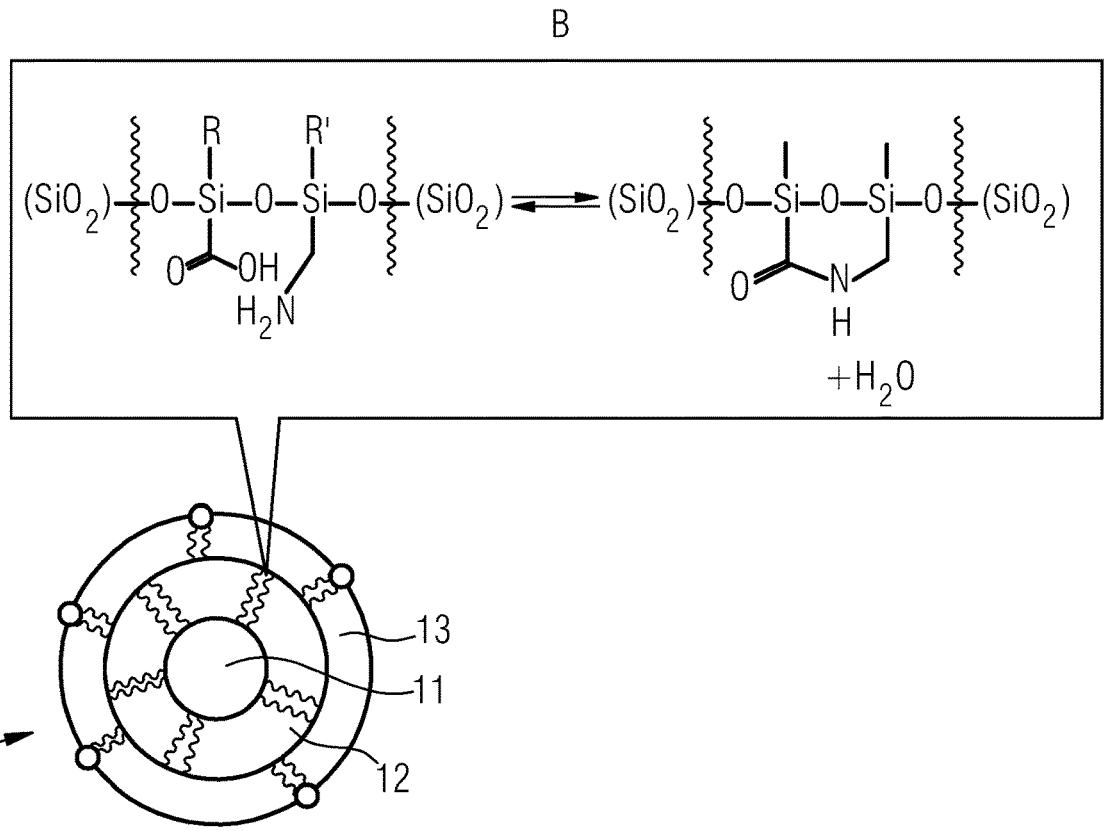
FIG. 5 shows a schematic side view of a cross sectional area of a quantum dot structure according to an exemplary embodiment and a corresponding reaction scheme.

FIG. 5 shows a schematic side view of a cross sectional area of a quantum dot structure according to an exemplary embodiment and a corresponding reaction scheme. The reaction in box B corresponds to the reaction in box B in FIG. 3a. Additionally, the functional groups are present within the encapsulation layer 12, also like in FIG. 3a. The quantum dot structure 1 of FIG. 5 has an additional sealing layer 13 on the surface of the encapsulation layer 12. The sealing layer 13 is made of controlled porous glass comprising silica nanopowder and chemically seals the encapsulation layer, in particular by sealing the pores as indicated in FIG. 5. This leads to a stable and controlled humidity inside the encapsulation layer 12 and, thus, in the environment of the quantum dot 11.

Figure 6:
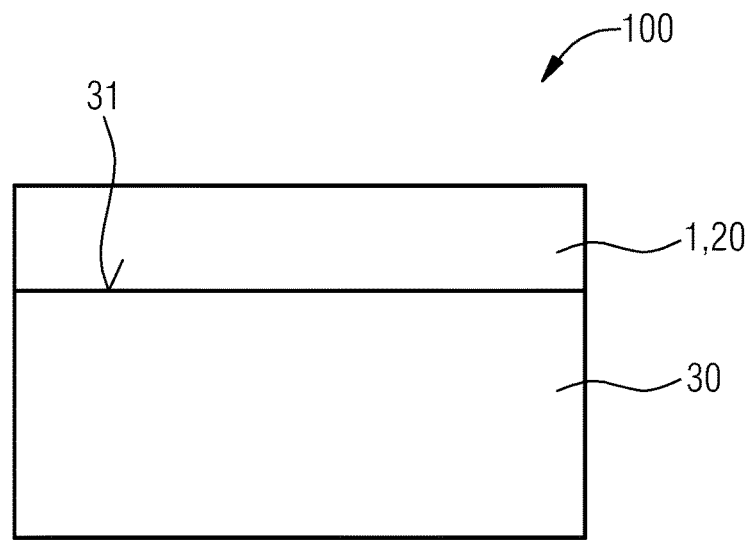
FIG. 6 shows a schematic side view of a cross sectional area of a light emitting device according to an exemplary embodiment.

FIG. 6 shows a schematic side view of a cross sectional area of a light emitting device 100, for example a LED, according to an exemplary embodiment. Shown is a semiconductor chip 30 which is configured to emit electromagnetic radiation of a first wavelength range and a conversion layer 20 comprising or consisting of quantum dot structures 1, for example a quantum dot structure as discussed with respect to the previous figures. The semiconductor chip 1 emits the radiation from a radiation exit surface 31.

The conversion layer 20 being applied on the radiation exit surface 31 is configured to convert the electromagnetic radiation of the first wavelength range into electromagnetic radiation of a second wavelength range. Apart from the quantum dot structure 1 the conversion layer can also comprise a matrix material in which the quantum dot structure 1 is embedded.

The light emitting device 100 has a high performance and a stable PLQY as the quantum dots have due to the encapsulation layer an optimal moisture content in their environment that can be adapted during life time of the LED by the reversible reactions of the functional groups.

The features and exemplary embodiments described in connection with the figures can be combined with each other according to further exemplary embodiments, even if not all combinations are explicitly described. Furthermore, the exemplary embodiments described in connection with the figures may have alternative or additional features as described in the general part.

The invention is not restricted to the exemplary embodiments by the description on the basis of said exemplary embodiments. Rather, the invention encompasses any new feature and also any combination of features, which in particular comprises any combination of features in the patent claims and any combination of features in the exemplary embodiments, even if this feature or this combination itself is not explicitly specified in the patent claims or exemplary embodiments.

REFERENCES

1 Quantum dot structure
5 Nanocrystalline core
6 Nanocrystalline shell
11 Quantum dot
12 Encapsulation layer
13 Sealing layer
14 Barrier layer
20 Conversion layer
30 Semiconductor chip
31 Radiation exit surface
100 Light emitting device
t Time
RRW Relative red watts

The invention claimed is:

1. A quantum dot structure, comprising:
a nanocrystalline core from a first semiconductor material,
a nanocrystalline shell from a second semiconductor material on the nanocrystalline core,
at least one encapsulation layer on the nanocrystalline shell,
wherein functional groups are present within the at least one encapsulation layer and/or on a surface of the at least one encapsulation layer facing away from the nanocrystalline shell, the functional groups being able to chemically react in a reversible manner.

2. The quantum dot structure according to claim 1, wherein the functional groups are able to react by a condensation and a hydrolysis reaction.

3. The quantum dot structure according to claim 1, wherein the at least one encapsulation layer comprises an encapsulation material and the functional groups are chemically bonded to the encapsulation material.

4. The quantum dot structure according to claim 3, wherein the encapsulation material is selected from a group of metal oxides the group consisting of silica, titanium oxide, zirconium oxide, alumina, magnesium oxide, and hafnia.

5. The quantum dot structure according to claim 1, wherein the functional groups comprise first functional groups and second functional groups and a pair of first functional groups and second functional groups is chosen from amine groups and carboxyl groups, thiourea groups and hydroxyl groups, hydroxyl groups and carboxyl groups, and carboxyl groups and hydroxyl groups.

6. The quantum dot structure according to claim 1, wherein the functional groups are chosen from a group of α-hydroxy aldehyde groups, β-hydroxy aldehyde groups, α-hydroxy ketone groups, β-hydroxy ketone groups, and mixtures thereof.

7. The quantum dot structure according to claim 1, comprising a plurality of encapsulation layers, wherein each two encapsulation layers are separated by the functional groups.

8. The quantum dot structure according to claim 1, further comprising a sealing layer on the at least one encapsulation layer, the sealing layer comprising a controlled porous glass.

9. The quantum dot structure according to claim 8, wherein the controlled porous glass comprises silica nanopowder.

10. The quantum dot structure according to claim 1, further comprising a barrier layer on the at least one encapsulation layer, the barrier layer comprising a metal oxide of a group consisting of silica, titanium oxide, zirconium oxide, alumina, magnesium oxide, and hafnia.

11. The quantum dot structure according to claim 10, wherein the barrier layer has a thickness in a range of up to 50 nm inclusive.

12. The quantum dot structure according to claim 1, wherein a moisture content on a surface of the nanocrystalline shell and/or the nanocrystalline core is controlled by the at least one encapsulation layer.

13. A method for producing a quantum dot structure, comprising:
   forming a nanocrystalline core from a first semiconductor material,
   forming a nanocrystalline shell from a second semiconductor material on the nanocrystalline core,
   forming at least one encapsulation layer on the nanocrystalline shell,
   wherein functional groups are present within the at least one encapsulation layer and/or on a surface of the at least one encapsulation layer facing away from the nanocrystalline shell, the functional groups being able to chemically react in a reversible manner.

14. The method according to claim 13, wherein forming the at least one encapsulation layer is performed by a sol-gel process.

15. The method according to claim 14, wherein the sol-gel process is chosen from a reverse micelle sol-gel process and a Stober method.

16. The method according to claim 14, wherein forming the at least one encapsulation layer comprises applying precursors of an encapsulation material and subsequently applying precursors of a functionalized encapsulation material.

17. The method according to claim 16, wherein after forming the at least one encapsulation layer the surface of the at least one encapsulation layer facing away from the nanocrystalline shell is treated with a base or an acid and/or remaining precursor and reaction byproducts are removed from the surface of the at least one encapsulation layer.

18. The method according to claim 17, further comprising forming at least one additional encapsulation layer on the surface of the at least one encapsulation layer facing away from the nanocrystalline shell.

19. The method according to claim 16, wherein the precursors of the encapsulation material are chosen from a group consisting of tetramethyl orthosilicate, tetraethyl orthosilicate, titanium isopropoxide, titanium butoxide, aluminum isopropoxide, aluminum-tri-sec-butoxide, aluminum tert-butoxide, zirconium propoxide, zirconium butoxide, tetraisopropoxyhafnium, hafnium n-butoxide, magnesium chloride hexahydrate, and mixtures thereof, and/or wherein the precursors of the functionalized encapsulation material are chosen from a group consisting of (3-aminopropyl)triethoxysilane, (triethoxysilyl)alkanoic acid, thiourea, silyl esters, dicholorsilanes, α-hydroxy aldehydes, β-hydroxy aldehydes, α-hydroxy ketones, β-hydroxy ketones, and mixtures thereof.

20. A light emitting device comprising:
   a semiconductor chip configured to emit electromagnetic radiation of a first wavelength range, and
   a conversion layer on the semiconductor chip, wherein the conversion layer is configured to convert the electromagnetic radiation of the first wavelength range into electromagnetic radiation of a second wavelength range, wherein the conversion layer comprises a quantum dot structure according to claim 1.

* * * * *